United States Patent
Jeong et al.

(10) Patent No.: US 7,099,211 B2
(45) Date of Patent: Aug. 29, 2006

(54) FLASH MEMORY DEVICE CAPABLE OF REDUCING TEST TIME AND TEST METHOD THEREOF

(75) Inventors: Jae-Yong Jeong, Kyungki-do (KR); Heung-Soo Lim, Kyungi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/232,816

(22) Filed: Sep. 21, 2005

(65) Prior Publication Data

US 2006/0018167 A1    Jan. 26, 2006

Related U.S. Application Data

(63) Continuation-in-part of application No. 10/677,841, filed on Oct. 1, 2003.

(30) Foreign Application Priority Data

Dec. 12, 2002  (KR) ............................. 2002-79083

(51) Int. Cl.
*G11C 29/00* (2006.01)

(52) U.S. Cl. ............ 365/201; 365/189.11; 365/230.06; 365/238.5

(58) Field of Classification Search ............... 365/201, 365/189.11, 230.06, 238.5
See application file for complete search history.

(56) References Cited

U.S. PATENT DOCUMENTS 5,654,925 A    8/1997  Koh et al. ................... 365/201
5,793,685 A *  8/1998  Suma ........................ 365/201
5,805,523 A *  9/1998  Lysinger ................. 365/230.08
6,236,594 B1   5/2001  Kwon ..................... 365/185.11
6,639,854 B1 * 10/2003  Hur et al. ................... 365/200

FOREIGN PATENT DOCUMENTS

JP    04-163798    6/1992
KR    2002-58992   7/2002

OTHER PUBLICATIONS

English Language of Abstract of Korean Patent Publication No. 2002-58992.
English Language of Abstract of Japanese Patent Publication No. 04-163798.

* cited by examiner

*Primary Examiner*—Tuan T. Nguyen
*Assistant Examiner*—Pho M. Luu
(74) *Attorney, Agent, or Firm*—Marger Johnson & McCollom, P.C.

(57) ABSTRACT

A flash memory device includes a memory cell array arranged in rows and columns; a pad configured to be supplied with a high voltage from the exterior during a stress test operation; a column decoder configured to select a part of the columns in response to column selection signals; and a column predecoder configured to generate the column selection signals in response to an all column selection signal and a column address. The column predecoder simultaneously drives the column selection signals with the high voltage from the pad when the all column selection signal is activated during the stress test operation.

14 Claims, 8 Drawing Sheets

202, 204, 206, 208, 212, 214, 216, 218

FLASH MEMORY DEVICE CAPABLE OF REDUCING TEST TIME AND TEST METHOD THEREOF

CROSS REFERENCE TO RELATED APPLICATIONS

This application is a continuation-in-part of copending U.S. patent application Ser. No. 10/677,841, filed 1 Oct. 2003, which claimed priority from Korean Patent Application No. 2002-79083, filed 12 Dec. 2002, the contents of which are hereby incorporated by reference in their entirety.

BACKGROUND

1. Technical Field

This disclosure relates to semiconductor memory devices and more particularly, to a flash memory device that is capable of reducing a test time.

2. Description of the Related Art

A flash memory device is a highly integrated information storage device in which write and erase operations can be done on board. A flash memory cell includes one field effect transistor (FET) having a selection gate, a floating gate, a source, and a drain. Any variation of a threshold voltage of the flash memory cell results in a fluctuation of the amount of charges on a floating gate. This fluctuation represents information, which is stored in the flash memory cell. A flash memory device is classified as either a NAND flash memory device or a NOR flash memory device. NAND flash memory devices are typically used as mass data storage devices, and NOR flash memory devices are typically used as information storage devices for high speed data processing.

Generally, a NOR flash memory cell has two states—a programmed state and an erased state. When the NOR flash memory cell is programmed, residual electrons are trapped on a floating gate and a threshold voltage rises. Thus, drain-source current does not flow to a selected flash memory cell. The programmed state of the flash memory cell is referred to as logic "0". When the flash memory cell is erased, there are a small number of residual electrons on the floating gate and source-drain current flows to the flash memory cell. The erased state of the flash memory cell is referred to as logic "1".

FIG. 1 is a block/circuit diagram illustrating a conventional NOR flash memory device 100. Referring to FIG. 1, a NOR flash memory device 100 includes an address buffer 110, a row predecoder 120, a row decoder 130, a cell array 140, a column predecoder 150, a column decoder 160, and a sense amplifier 170. In the cell array 140, flash memory cells (not shown) are arranged at the intersections of wordlines WLi and bitlines BLi. The address buffer 110 receives an address signal ADDR from the outside so as to program or erase the flash memory cells and divides a row address RowAdd from a column address ColAdd by means of an output of the address buffer 110. The row predecoder 120 decodes the received row address RowAdd to generate a row selection signal RowSel. The row decoder 130 enables a predetermined wordline WLi in response to the row selection signal RowSel and drives the wordline WLi to a predetermined voltage level according to an operation mode of the flash memory device 100. In a program mode, the wordline WLi is driven to a voltage level of 10V. In an erase mode, the wordline WLi is driven to a voltage level of −10V. In a read mode, the wordline WLi is driven to a voltage level of 4.5V.

The column predecoder 150 decodes the received column address ColAdd to generate column selection signals ColSel1[m:0] and ColSel2[n:0]. The column decoder 160 selects a predetermined bitline BLi in response to the column selection signals ColSel1[m:0] and ColSel2[n:0] and connects a selected bitline BLi with the sense amplifier 170 through a data line DLj(j=0–3). For the convenience of description, 16 bitlines BLi (i=0–15) are described. A first column selection signal ColSel1[m:0] selects four bitlines (e.g., BL0, BL5, BL9, BL12) and a second column selection signal ColSel2[n:0] selects one (e.g., BL0) of the selected four bitlines to connect the selected one bitline with a data line (e.g., DL0).

FIG. 2 is a circuit diagram further illustrating the column predecoder 150 of FIG. 1. Referring to FIG. 2, the column predecoder 150 inputs column addresses ColAdd[3:0] to selectively generate first column selection signals ColSel1[3:0] and second column selection signals ColSel2[3:0]. The first and second column addresses ColAdd[0] and ColAdd[1] are decoded through a decoding block 200 to drive level shifters 202, 204, 206, and 208.

FIG. 3 is a circuit diagram illustrating the level shifters 202, 204, 206, and 208 of FIG. 2. Each of the level shifters 202, 204, 206, and 208 is structured as shown in FIG. 3 and generates a high voltage HV of about 10V as its output OUT in response to a low-level input signal IN. Four transistors in the column decoder 160 corresponding to the first column selection signals ColSel1[0], ColSel1[1], ColSel1[2], and ColSel1[3], respectively, are turned on when a high voltage HV appears as the output OUT of the level shifter 202, 204, 206, or 208, respectively. The third and fourth column addresses ColAdd[2] and ColAdd[3] generate second column selection signals ColSel2[0], ColSel2[1], ColSel2[2], and ColSel2[3] of high voltage HV through a decoding block 210 and level shifters 212, 214, 216, and 218. The second column selection signals ColSel2[0], ColSel2[1], ColSel2[2], and ColSel2[3] of high voltage HV select one of the four bitlines (BLi of FIG. 1). Each bitline BLi is coupled to one of the four transistors that are turned on by an activated first column selection signal ColSel1[0], ColSel1 [1], ColSel1[2], or ColSel1[3]. In this way the selected signal is connected with a data line.

FIGS. 4A and 4B are cross-sectional diagrams illustrating the column selection transistors of FIG. 1 and where stresses occur in those transistors. When the flash memory device (100 of FIG. 1) is in the program mode, according to a programming type, a voltage of 5V is applied to a bitline of a selected memory cell and a voltage of 0V is applied to a bitline of an unselected memory cell.

The state of the bias of a transistor MF in a first group of transistors 161 (FIG. 1) coupled to the bitline of the unselected memory cell is described below with reference to FIG. 4A. A high voltage of about 10V is applied to a gate of the transistor MF by a first column selection signal ColSel1 [0] that is coupled to the gate. A voltage of 0V is applied to a source of the transistor MF by a bitline BL0. Thus, a voltage of 10V is applied between the gate and the source of the transistor MF, and a voltage of 0V is applied to the data line DL0 of FIG. 1 that is coupled to the unselected memory cell.

The state of the bias of a transistor MS in a second group of transistors 162 (FIG. 1) is described below with reference to FIG. 4B. A high voltage of about 10V is applied to a gate of the transistor MS by a second column selection signal ColSel2[0] that is coupled to the gate of the transistor MS, and a voltage of 0V is applied to a drain of the transistor MS that is connected to the data line DL0. This state is maintained until the program is completed, which leads to increase gate oxide stress of the transistors MF and MS.

Furthermore, when the flash memory device (100 of FIG. 1) is in an erase mode, a voltage of about 9V is applied to a bulk that is coupled to a bitline. In this case, the first and second column selection signals ColSel1[m:0] and ColSel2[n:2] have a voltage of about 0V. Accordingly, a voltage of 0V is applied to the gates of the first group of the transistors 161 and a coupling voltage of 9V is applied to the sources thereof. As a result, gate oxide stress in the first group of transistors 161 occurs.

Over time, oxide stress from repeated program and erase operations may degrade the gate oxide layer to cause the transistor to malfunction. This contributes to faulty operation of the flash memory device. Accordingly, there is a need for a method of detecting a transistor error caused by the degradation of the gate oxide layer.

Since the first and second column selection signals ColSel1[m:0] and ColSel2[n:2] alternately apply a high voltage, it takes a long time to screen the transistor error by applying a stress to the first and second groups of the transistors in the column decoder (160 of FIG. 1). Furthermore, after a stress test, additional procedures such as reiteration of program and read operations must be performed to determine whether transistors in the column decoder have leakage paths caused by gate oxide deterioration and/or breakage. As a result, the test time that is required increases.

Embodiments of the invention address these and other disadvantages of the conventional art.

SUMMARY

Among other things, flash memory devices according to embodiments of the invention are capable of reducing a stress test time and reducing a time required to screen defective transistors.

BRIEF DESCRIPTION OF THE DRAWINGS

A more complete appreciation of the invention, and many of the attendant advantages thereof, will become readily apparent as the same becomes better understood by reference to the following detailed description when considered in conjuction with the accompanying drawings in which like reference symbols indicate the same or similar components, wherein.

DETAILED DESCRIPTION

Several exemplary embodiments of the invention are described below with reference to the attached drawings.

Figure 1:
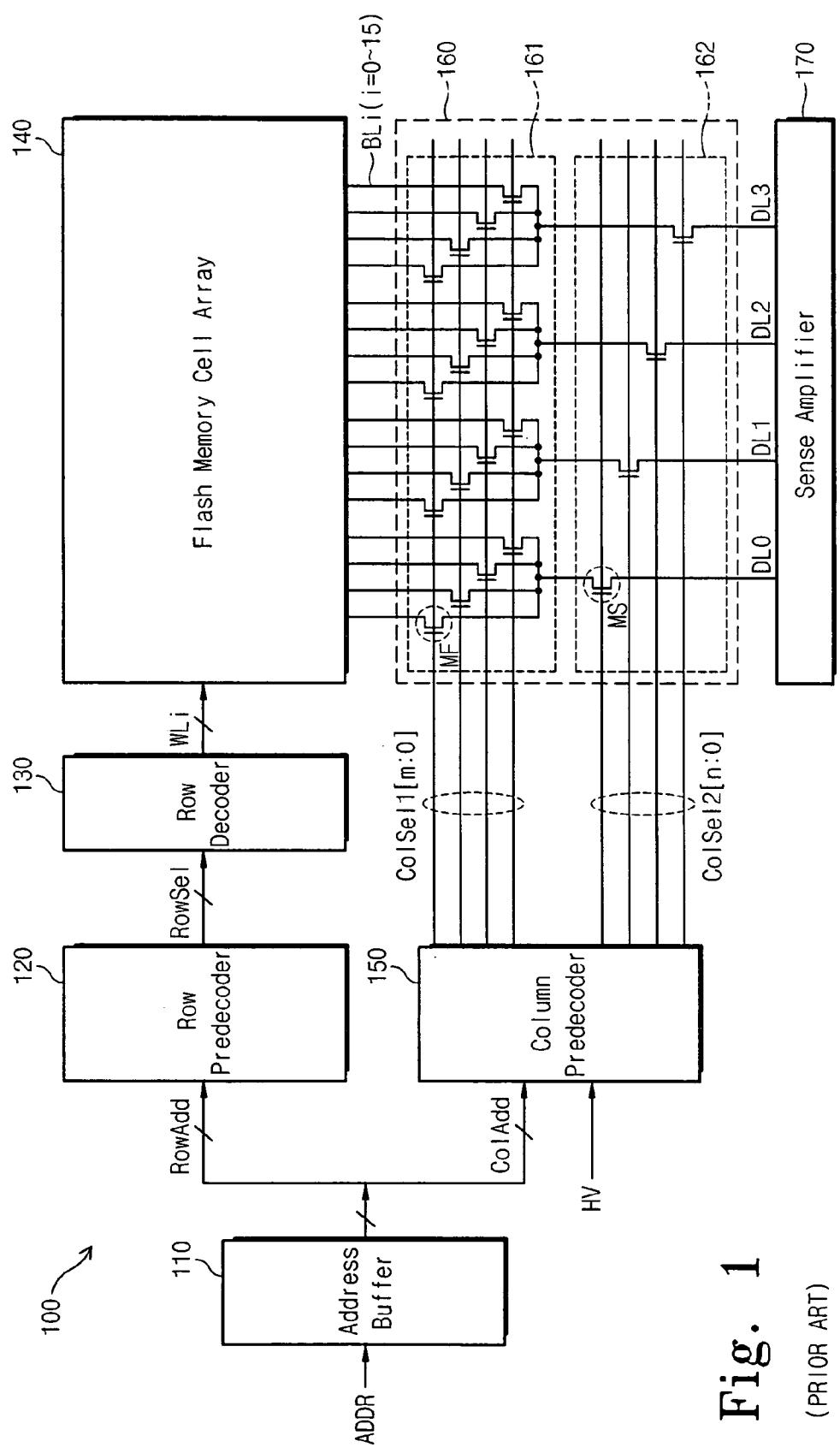
FIG. 1 is a block/circuit diagram illustrating a conventional flash memory device.
Figure 5:
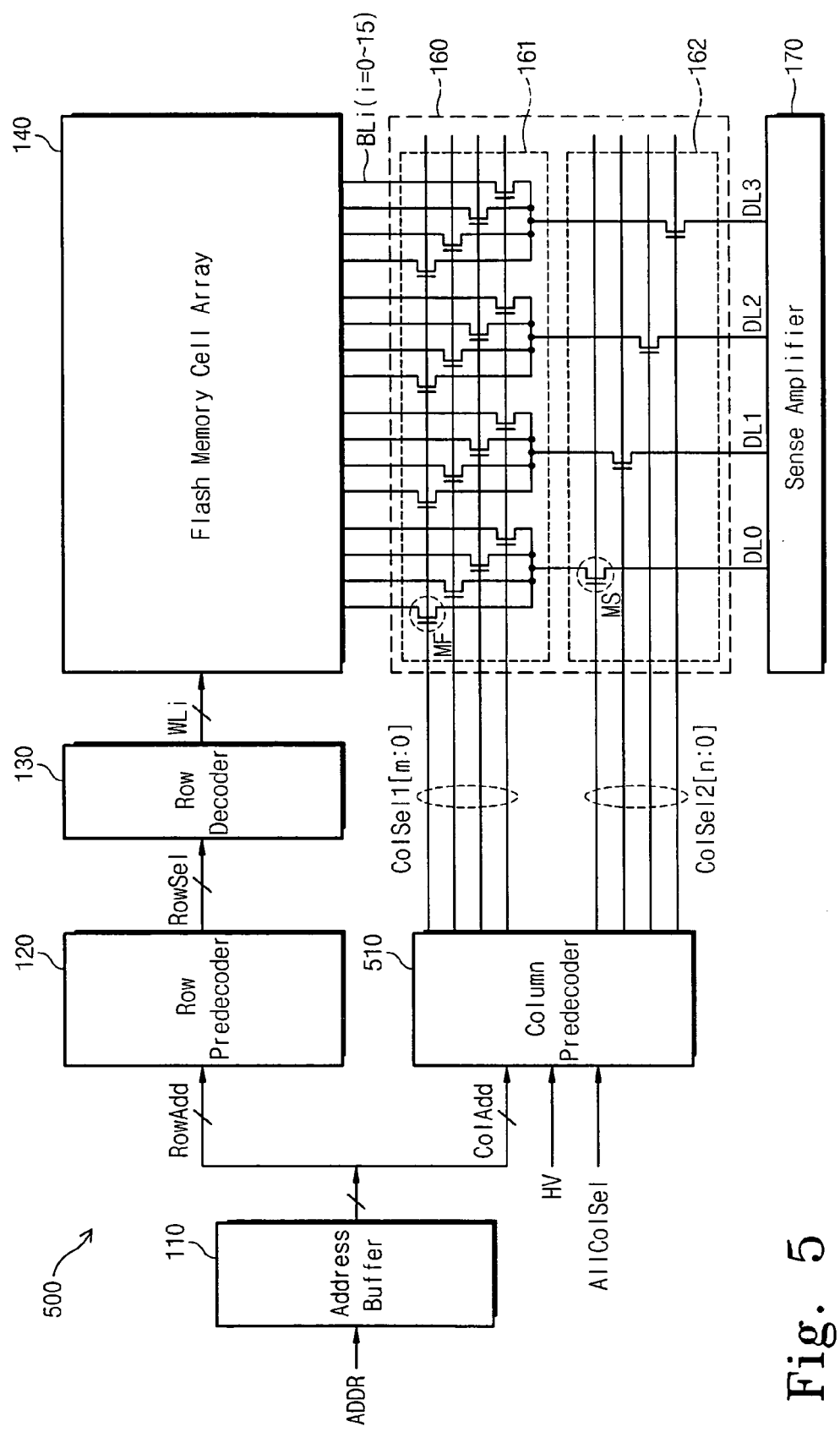
FIG. 5 is a block/circuit diagram illustrating a flash memory device according to some embodiments of the invention.

FIG. 5 is a block/circuit diagram illustrating a flash memory device 500 according to some embodiments of the invention. The flash memory device 500 is substantially similar to the flash memory device 100 shown in FIG. 1 except in regards to a column predecoder 510. The column predecoder 510 selectively or entirely generates column selection signals ColSel1[m:0] and ColSel2[n:0] in response to a column address ColAdd and an all column selection signal AllColSel.

Figure 3:
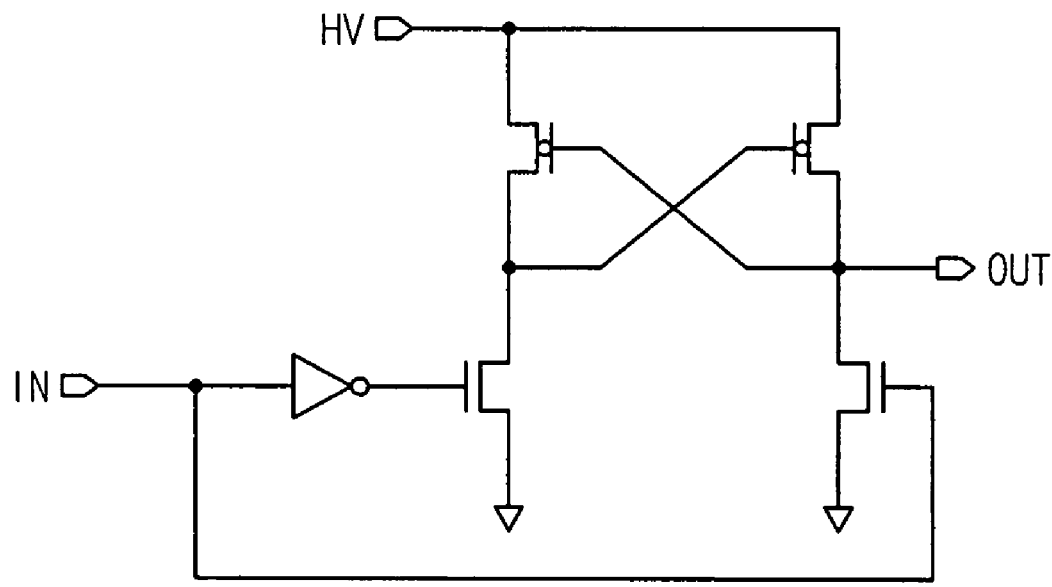
FIG. 3 is a circuit diagram illustrating the level shifter of FIG. 2.
Figure 4A:
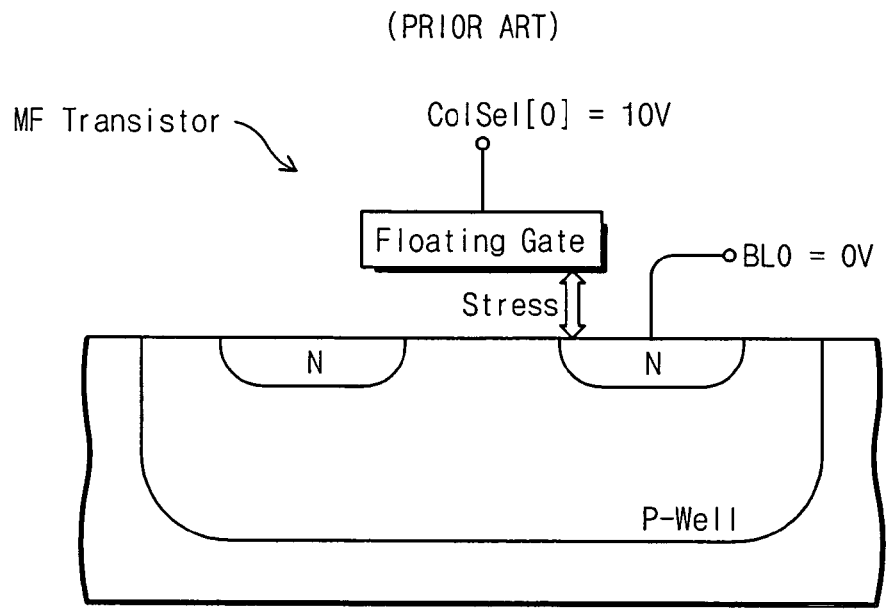
FIGS. 4A and 4B are cross-sectional diagrams illustrating the column selection transistors of FIG. 1 and where stresses occur in those transistors.
Figure 4B:
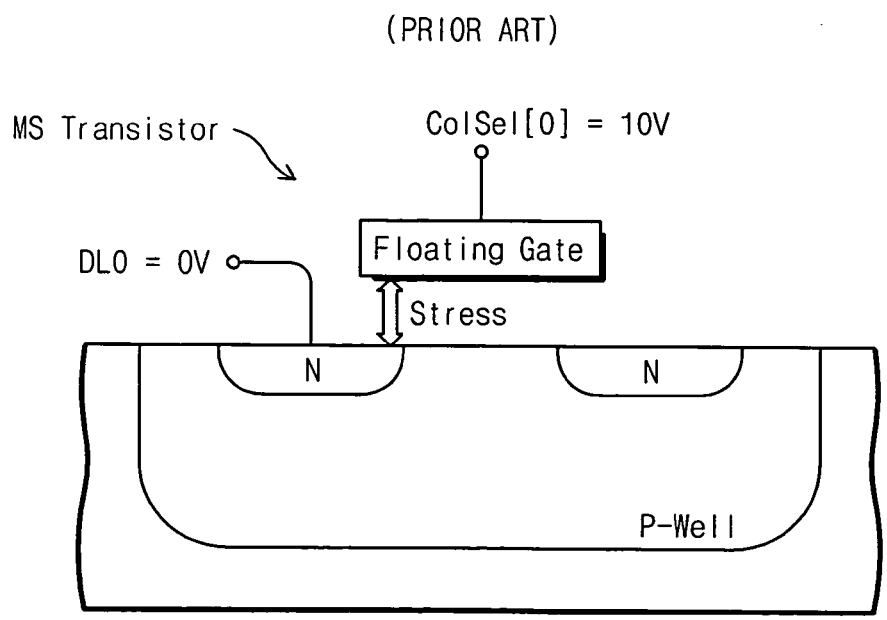
Figure 6:
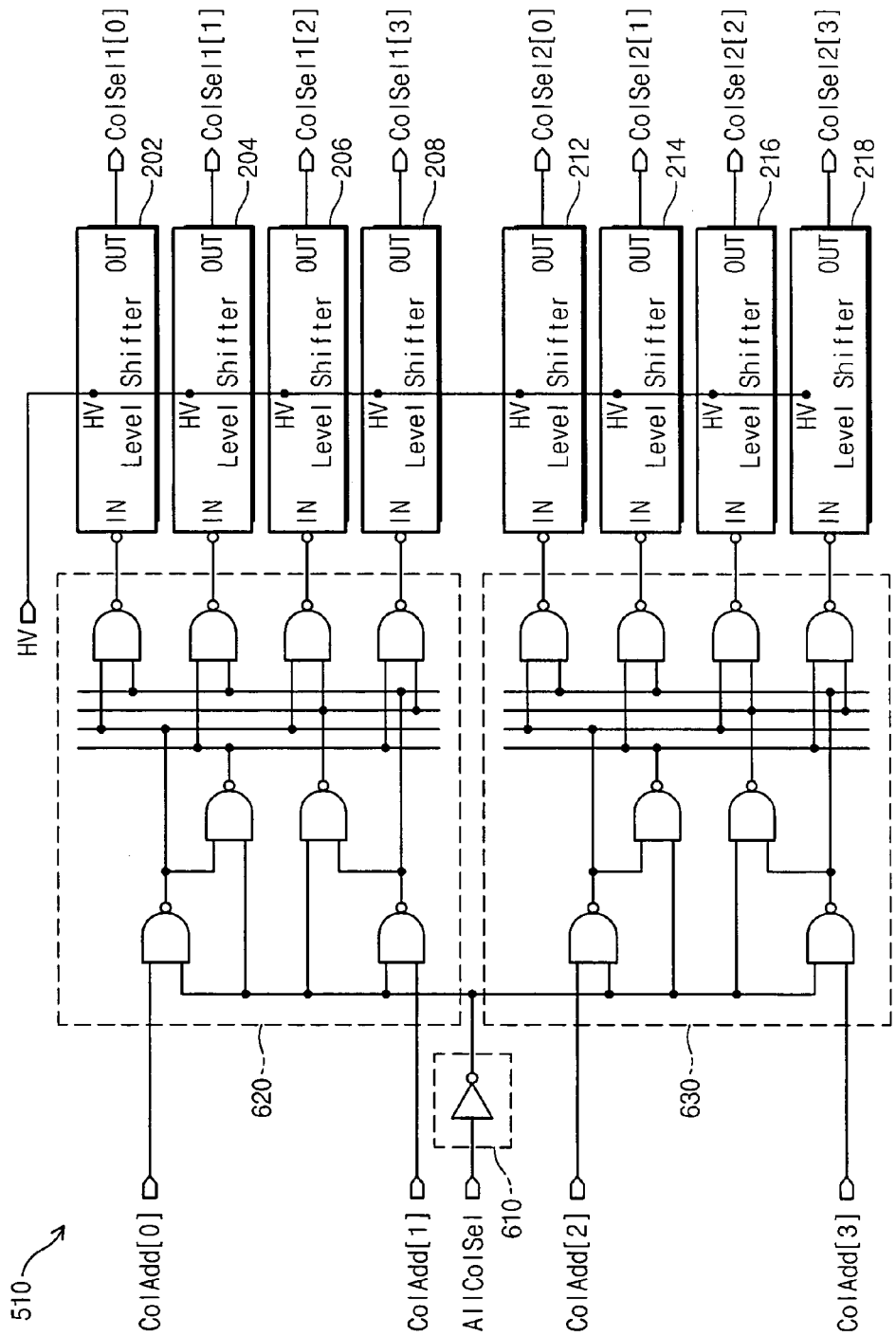
FIG. 6 is a circuit diagram illustrating the column predecoder of FIG. 5.

FIG. 6 is a circuit diagram further illustrating the column predecoder 510 of FIG. 5. Referring to FIG. 6, the column predecoder 510 includes a buffer unit 610, decoder units 620 and 630, and level shifters 202, 204, 206, 208, 212, 214, 216, and 218. These level shifters 202, 204, 206, 208, 212, 214, 216, and 218 are identical to the level shifters of FIG. 3. The buffer unit 610 is composed of an inverter that receives as input the all column selection signal AllColSel. When AllColSel is activated high, an output of the buffer unit 610 is low. The decoder units 620 and 630 combine column addresses ColAdd[0], ColAdd[1], ColAdd[2], ColAdd[3], and the output of the buffer unit 610. The outputs of the first and second decoder units 620 and 630 are used by the level shifters 202, 204, 206, 208, 212, 214, 216, and 218 to generate first and second column selection signals ColSel1[0], ColSel1[1], ColSel1[2], ColSel1[3], ColSel2[0], ColSel2[1], ColSel2[2], and ColSel2[3], respectively.

When the output of the buffer unit 610 is low, the outputs of the decoders 620 and 630 become low, causing the level shifters 202, 204, 206, 208, 212, 214, 216, and 218 to generate ColSel1[0], ColSel1[1], ColSel1[2], ColSel1[3], ColSel2[0], ColSel2[1], ColSel2[2], and ColSel2[3] at the high voltage (HV). The high voltage HV is then applied to the gates of the column selection transistors 161 and 162 in the column decoder 160 of FIG. 1, thereby turning on the column selection transistors. Preferably, the column selection transistors 161 and 162 are composed of NMOS transistors. A high voltage may be directly applied from an external source that is higher than the power supply voltage, which means that a stress application test may be conducted at one time for all the column selection transistors 161 and 162. During the stress test, the potential of the bitlines BLi is about 0V.

Figure 2:
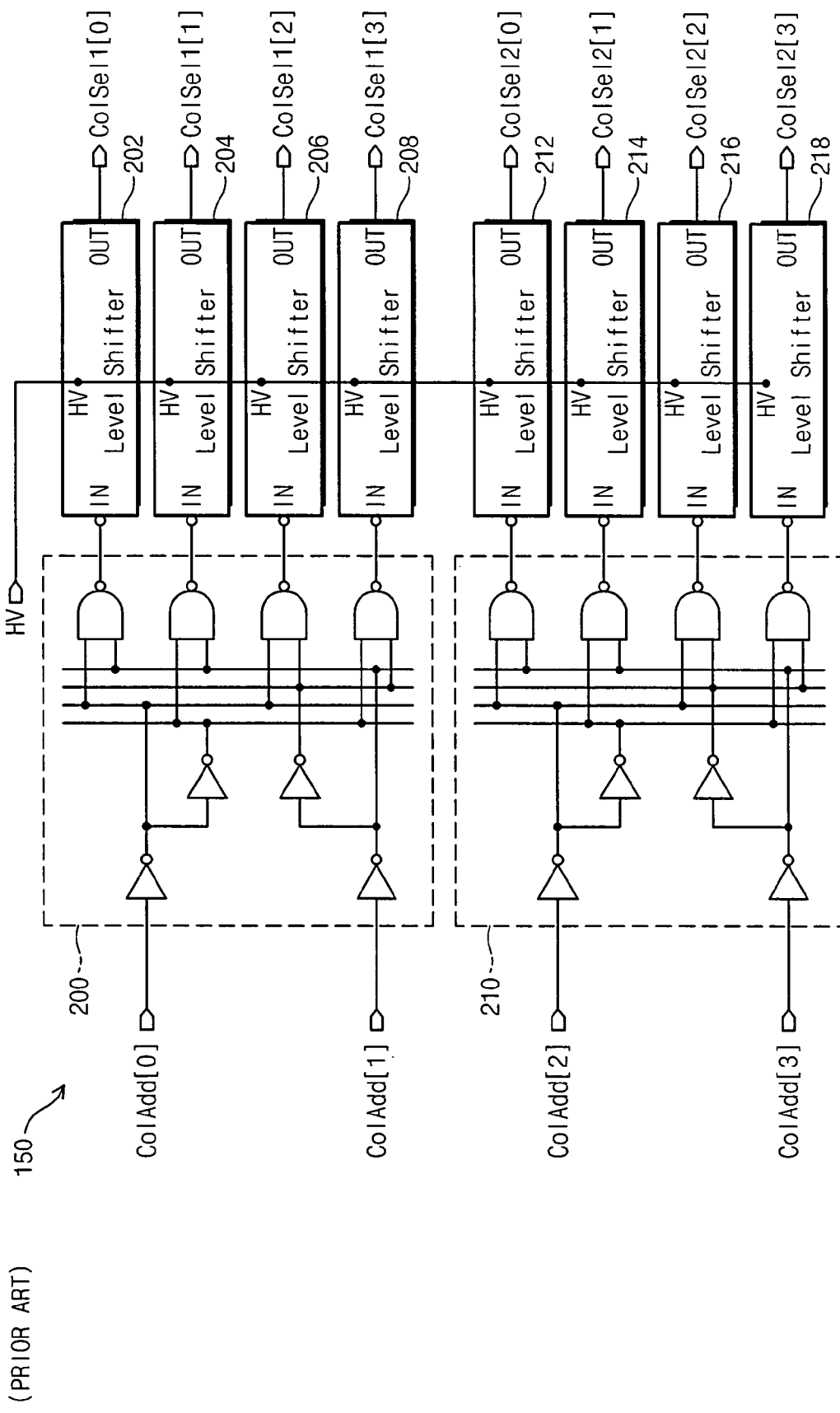
FIG. 2 is a circuit diagram illustrating the column predecoder of FIG. 1.

When the all column selection signal AllColSel is deactivated low, the output of the buffer 610 is high. When the output of the buffer 610 is high, the decoder units 620 and 630 operate the same way as the decoders 200 and 210 of FIG. 2. That is, when the first column selection signals ColSel1[0], ColSel1[1], ColSel1[2], and ColSel1[3] are at a high voltage level, each signal turns on four transistors among the first group of the column selection transistors (161 of FIG. 5). The third and fourth column addresses ColAdd[2] and ColAdd[3] generate the second column selection signals ColSel2[0], ColSel2[1], ColSel2[2], and ColSel2[3] through the decoding block 630 and the level shifters 212, 214, 216, and 218. When a second column selection signal ColSel2[0], ColSel2[1], ColSel2[2], and ColSel2[3] is at the high voltage level, it activates one of the four transistors in the second group of column selection transistors 162. This connects the selected data line DLi to a bitline BLi (see FIG. 5) that is coupled to one of the four column selection transistors turned on by an activated first column selection signals ColSel1[0], ColSel1[1], ColSel1[2], and ColSel1[3].

According to some embodiments of the invention, the column predecoder 510 simultaneously selects all column selection transistors to conduct a stress test. Therefore, the time required for the stress test can be shortened.

Figure 7:
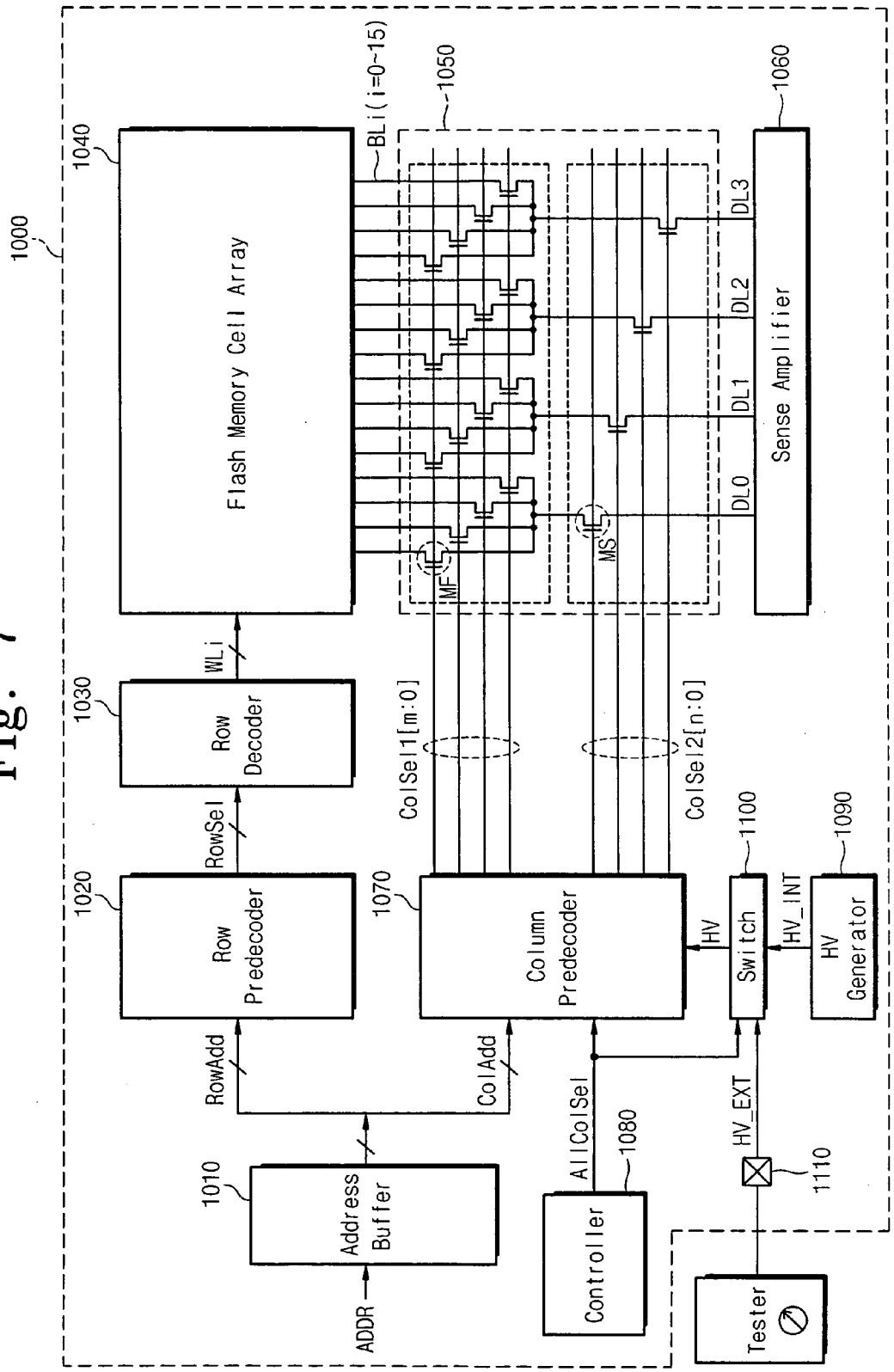
FIG. 7 is a block/circuit diagram illustrating a flash memory device according to other embodiments of the invention.

FIG. 7 is a block/circuit diagram illustrating a flash memory device 1000 according to other embodiments of the invention. Referring to FIG. 7, the flash memory device 1000 is identical to the device 500 illustrated in FIG. 5 except that the memory device further includes a controller 1080, a high voltage generator circuit 1090, a switch circuit 1100, and a pad 1110 as a high voltage input part.

The controller 1080 is configured to generate an all column selection signal AllColSel during a stress test operation. The high voltage generator circuit 1090 generates a high voltage HV_INT and is well known in the art. The pad 1110 is electrically connected to a tester at the stress test operation and is supplied with a high voltage HV_EXT. The switch circuit 1100 selects either one of the high voltages HV_INT and HV_EXT in response to the all column selection signal AllColSel. For example, when the all column selection signal AllColSel is inactivated, the switch circuit 1100 selects the high voltage HV_INT from the high voltage generator circuit 1090. When the all column selection signal AllColSel is activated, the switch circuit 1100 selects the high voltage HV_EXT from the tester through the pad 1110. A high voltage HV from the switch circuit 1100 is applied to a column predecoder 1070. The column predecoder 1070 activates all column selection signals ColSel1[m:0] and ColSel2[n:0] when the all column selection signal AllColSel is activated. The activated signals ColSel1[m:0] and ColSel2[n:0] are all supplied with the high voltage HV from the switch circuit 1100.

The flash memory device 1000 has the following advantage when a stress test operation is carried out. Once the flash memory device enters the stress test operation, the controller 1080 activates the all column selection signal AllColSel. At the same time, the pad 1110 is electrically connected to the tester so as to be supplied with the high voltage HV_EXT. As the all column selection signal AllColSel is activated, the switch circuit 1100 selects the high voltage HV_EXT from the tester instead of that from the high voltage generator circuit 1090. The column predecoder circuit 1070 drives the signals ColSel1[m:0] and ColSel2[n:0] with the high voltage HV, which is supplied from the exterior through the pad 1110. As the column selection signals ColSel1[m:0] and ColSel2[n:0] are driven with the high voltage HV, transistors in the column decoder 1050 suffer stress. When the high voltage HV is supplied to the transistors in the column decoder 1050, the tester measures current variation at the pad 1110. That is, leakage current through the pad 1110 is directly measured by the tester while the transistors in the column decoder 1050 suffer stress. Current variation means that at least one of transistors in the column decoder 1050 is defective and that a leakage path is made by the defective transistor.

In conclusion, it is possible to measure leakage current caused by transistors in the column decoder 1050 at the stress test operation. This means that a further procedure for finding defective transistors in the column decoder 1050 is skipped. Thus, the flash memory device 1000 according to the second embodiment can reduce a test time by performing a stress test operation and a leakage detecting operation at the same time.

It should be apparent to those skilled in the art that a variable high voltage from the tester may be supplied.

Figure 8:
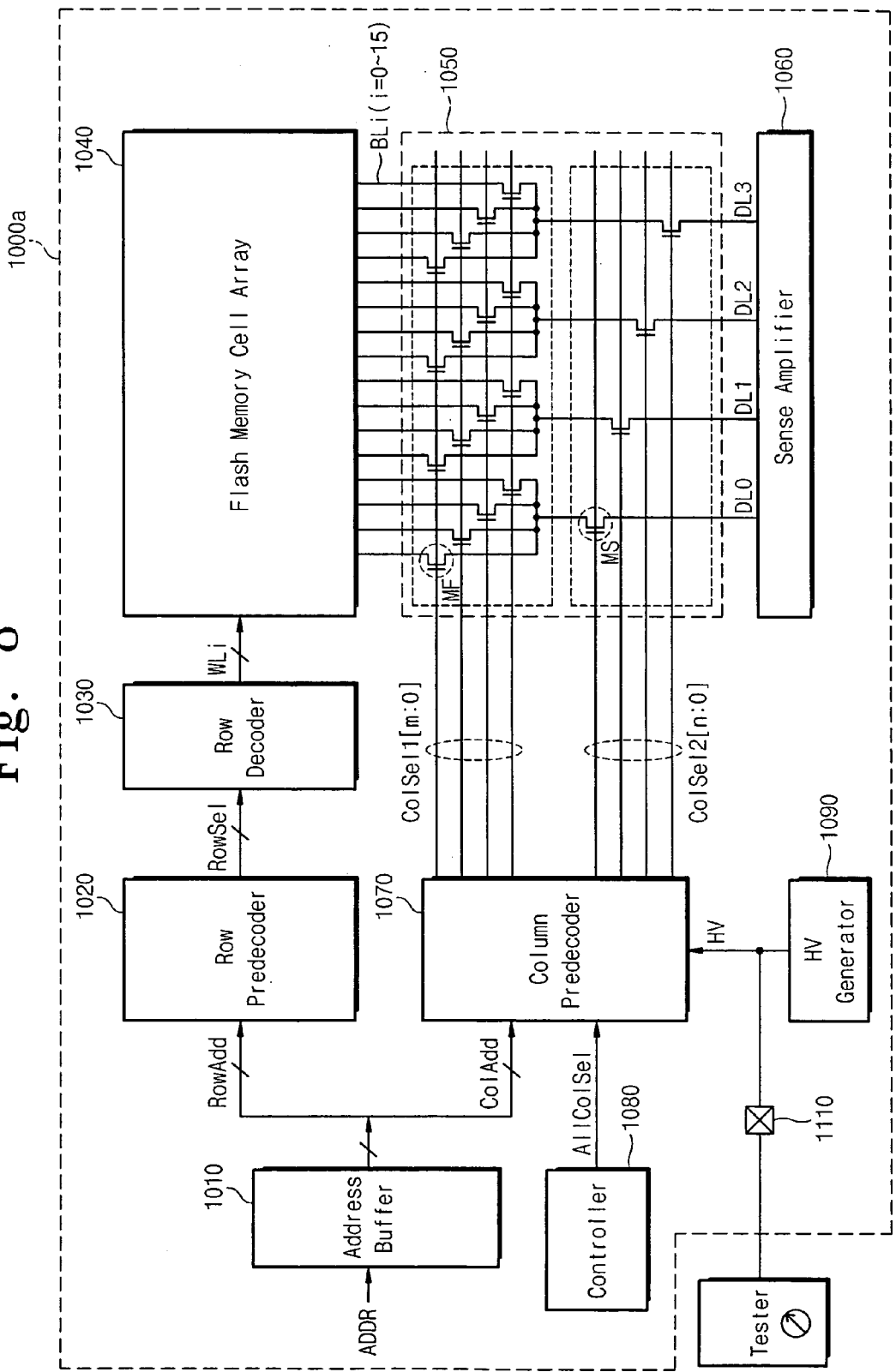
FIG. 8 is a block/circuit diagram illustrating a flash memory device according to different embodiments of the invention.

FIG. 8 is a block/circuit diagram illustrating a flash memory device 1000a according to different embodiments of the invention. The flash memory device 1000a according to these embodiments are identical to those of FIG. 7 except that the switch circuit 1100 of FIG. 7 is removed. Although the switch circuit 1100 is removed, the high voltage generator circuit 1090 does not operate when a high voltage is supplied to the pad 1110 from the tester. This is because the high voltage generator circuit 1090 automatically stops generating a high voltage when an output voltage of the high voltage generator circuit 1090 reaches a target voltage. Except for the difference described above, the flash memory device 1000a in FIG. 8 operates in the same fashion as the flash memory device 1000 of FIG. 7.

The invention may be practiced in many ways. Some exemplary, non-limiting descriptions of embodiments of the invention are described below.

According to some embodiments, a flash memory device includes a cell array of memory cells arranged in rows and columns; a high voltage input part configured to be supplied with a high voltage from the exterior during a stress test operation; a column decoder configured to select a part of the columns in response to column selection signals; and a column predecoder configured to generate the column selection signals in response to an all column selection signal and a column address, wherein the column predecoder simultaneously drives the column selection signals with the high voltage from the pad when the all column selection signal is activated during the stress test operation.

In some embodiments, during the stress test operation, leakage current to the pad is directly measured by an external tester for supplying the high voltage.

In some embodiments, the memory device further includes a high voltage generator circuit configured to generate a high voltage; and a switch circuit configured to select either one of the high voltage from the pad and the high voltage from the high voltage generator circuit in response to the all column selection signal, the selected high voltage being supplied to the column predecoder.

In some embodiments, the switch circuit selects the high voltage from the pad at activation of the all column selection signal and the high voltage from the high voltage generator circuit at inactivation of the all column selection signal, the selected high voltage being supplied to the column predecoder.

In some embodiments, the column decoder includes column selection transistors that are configured to select at least one of the columns.

In some embodiments, the column predecoder includes a buffer unit configured to receive the all column selection signal; decoder units configured to decode an output of the buffer unit and a column address; and level shifters configured to generate the column selection signals that are applied to gates of the column selection transistors in response to an output of the decoder units, wherein the level shifters are configured to apply the high voltage from the pad to all the column selection transistors during the stress test operation in response to the all column selection signal.

In some embodiments, the buffer unit includes an inverter.

In some embodiments, each of the decoder units includes a NAND gate configured to receive the output of the buffer unit and the column address.

In some embodiments, each of the level shifters include first and second PMOS transistors, each of the first and second transistors having a source, a drain, and a gate, the sources of the first and second PMOS transistors being coupled to the high voltage and the gates thereof being cross-coupled to the drains thereof; an inverter configured to invert the output of the decoder unit; a first NMOS transistor coupled between the drain of the first PMOS transistor and a ground voltage, with a gate of the first NMOS transistor coupled to an output of the inverter; and a second NMOS transistor coupled between the drain of the second PMOS transistor and the ground voltage, with a gate of the second NMOS transistor coupled to the output of the decoder unit, and with a drain of the second NMOS transistor coupled to the drain of the second PMOS transistor to generate the column selection signal.

In some embodiments, the high voltage has a voltage level higher than a power supply voltage.

In some embodiments, a constant voltage level is applied to the columns during the stress test operation.

In some embodiments, the constant voltage level is a ground voltage level.

In some embodiments, the high voltage input part includes a pad.

The invention was described above using exemplary preferred embodiments. However, it is to be understood that the scope of the invention is not limited to the disclosed embodiments. On the contrary, it is intended to cover various modifications and similar arrangements that would be apparent to those skilled in the art. The scope of the claims, therefore, should be accorded the broadest interpretation so as to encompass all such modifications and similar arrangements.

The invention claimed is:

1. A flash memory device comprising:
a memory cell array arranged in rows and columns;
a high voltage input part configured to be supplied with an external high voltage during a stress test operation of the flash memory device;
a column decoder configured to select a part of the columns in response to column selection signals; and
a column predecoder configured to generate the column selection signals in response to an all column selection signal and a column address, the column predecoder configured to simultaneously drive the column selection signals with the external high voltage when the all column selection signal is activated during the stress test operation.

2. The flash memory device of claim 1, wherein during the stress test operation, leakage current to the high voltage input part is measured directly by an external tester.

3. The flash memory device of claim 1, further comprising:
a high voltage generator circuit configured to generate a high voltage; and
a switch circuit configured to supply a selected high voltage to the column predecoder in response to the all column selection signal, the selected high voltage chosen from the group consisting of the high voltage from the high voltage generator circuit and the external high voltage from the high voltage input part.

4. The flash memory device of claim 3, the switch circuit configured to select the external high voltage from the high voltage input part when the all column selection signal is activated and configured to select the high voltage from the high voltage generator circuit when the all column selection signal is inactivated.

5. The flash memory device of claim 1, wherein the column decoder comprises column selection transistors that are configured to select at least one of the columns.

6. The flash memory device of claim 5, wherein the column predecoder comprises:

a buffer unit configured to receive the all column selection signal;
decoder units configured to decode an output of the buffer unit and a column address; and
level shifters configured to generate the column selection signals in response to an output of the decoder circuits and configured to apply the column selection signals to gates of the column selection transistors, the level shifters further configured to apply the external high voltage from the high voltage input part to all the column selection transistors during the stress test operation in response to the all column selection signal.

7. The flash memory device of claim 6, the buffer unit comprising an inverter.

8. The flash memory device of claim 6, each of decoder units comprising a NAND gate configured to input the column address and an output of the buffer unit.

9. The flash memory device of claim 6, each level shifter comprising:
a first PMOS transistor having a source, a drain, and a gate;
a second PMOS transistor having a source, a drain, and a gate, the sources of the first and second PMOS transistors coupled to the high voltage, the gates of the first and second PMOS transistors cross-coupled to the drains;
an inverter configured to invert an output of the decoder unit;
a first NMOS transistor coupled between the drain of the first PMOS transistor and a ground voltage, a gate of the first NMOS transistor coupled to an output of the inverter; and
a second NMOS transistor coupled between the drain of the second PMOS transistor and the ground voltage, a gate of the second NMOS transistor coupled an output of the decoder unit, a drain of the second NMOS transistor coupled to the drain of the second PMOS transistor to generate the column selection signal.

10. The flash memory device of claim 1, the high voltage greater than a power supply voltage.

11. The flash memory device of claim 1, wherein a constant voltage level is applied to the columns during the stress test operation.

12. The flash memory device of claim 11, wherein the constant voltage level is a ground voltage level.

13. The flash memory device of claim 1, wherein the high voltage input part comprises a pad.

14. A device comprising:
a memory cell array arranged in rows and columns;
a high voltage input configured receive an external high voltage during a stress test operation of the device;
a column decoder configured to select a part of the columns in response to column selection signals; and
a column predecoder configured to generate the column selection signals in response to an all column selection signal and a column address, the column predecoder configured to simultaneously drive the column selection signals with the external high voltage when the all column selection signal is activated during the stress test operation.

* * * * *